United States Patent
Lee et al.

(10) Patent No.: US 8,207,788 B2
(45) Date of Patent: Jun. 26, 2012

(54) CALIBRATED FEEDBACK

(75) Inventors: Wai L. Lee, Austin, TX (US); Patrick A. Quinn, Beaverton, OR (US); Garry N. Link, Pacific City, OR (US); Adam C. Broun, Portland, OR (US); Eric T. King, San Jose, CA (US)

(73) Assignee: Avnera Corporation, Beaverton, OR (US)

( * ) Notice: Subject to any disclaimer, the term of this patent is extended or adjusted under 35 U.S.C. 154(b) by 394 days.

(21) Appl. No.: 12/082,081

(22) Filed: Apr. 7, 2008

(65) Prior Publication Data
US 2008/0272842 A1 Nov. 6, 2008

Related U.S. Application Data

(60) Provisional application No. 60/922,342, filed on Apr. 6, 2007.

(51) Int. Cl.
*H03F 3/217* (2006.01)

(52) U.S. Cl. ...................................................... 330/251
(58) Field of Classification Search .................. 330/251, 330/207 A
See application file for complete search history.

(56) References Cited

U.S. PATENT DOCUMENTS 7,262,658 B2 * 8/2007 Ramaswamy et al. ........ 330/251
* cited by examiner

*Primary Examiner* — Robert Pascal
*Assistant Examiner* — Khiem Nguyen
(74) *Attorney, Agent, or Firm* — Joseph P. Curtin, L.L.C.

(57) ABSTRACT

A differential feedback amplifier is provided with a feedback network wherein that feedback network is adjustable so as to improve the PSRR of the amplifier. In another aspect of the present invention, a differential feedback amplifier is provided with a feedback network wherein that feedback network is adjustable so as to improve the CMRR of the amplifier. In a further aspect of the present invention, a Class D amplifier is provided with a passive differential feedback, summing with an input current at a differential virtual ground produced by an amplifier which is a sub-section of the Class D amplifier.

19 Claims, 5 Drawing Sheets

CALIBRATED FEEDBACK

CROSS-REFERENCE TO RELATED APPLICATIONS

This non-provisional application claims the benefit of U.S. Provisional Application 60/922,342, filed 6 Apr. 2007, and entitled "Calibrated Feedback"; the entirety of which is hereby incorporated by reference.

FIELD OF THE INVENTION

The present invention relates generally to amplifiers with differential negative feedback paths, and more particularly relates to adjusting the net gain of one or more of the differential feedback paths.

BACKGROUND

Harold S. Black, while working at Bell Labs, changed the design world when he published his work on feedback in "Stabilized Feed-Back Amplifiers" in the January 1934 issue of Electrical Engineering, published by the American Institute of Electrical Engineering. This work is also memorialized as U.S. Pat. No. 2,102,671, filed Apr. 22, 1932. Since then, legions of designers have employed negative feedback to produce everything from hearing aides to camera controllers for Jupiter probes.

What is needed are methods and apparatus for calibration of a feedback path to achieve improved performance, especially as it relates to improving the Power-Supply Rejection Ratio (PSRR) of a circuit structure having differential feedback; and specifically for calibrating the gain-balance of the differential feedback path so as to optimize PSRR.

SUMMARY OF THE INVENTION

Briefly, a differential feedback amplifier is provided with a feedback network wherein that feedback network is adjustable so as to improve the PSRR of the amplifier.

In another aspect of the present invention, a differential feedback amplifier is provided with a feedback network wherein that feedback network is adjustable so as to improve the common-mode rejection ratio (CMRR) of the amplifier.

In a further aspect of the present invention, a Class D amplifier is provided with a passive differential feedback network, summing with an input current at a differential virtual ground produced by an amplifier which is a subsection of the Class D amplifier.

DETAILED DESCRIPTION

Generally, a differential amplifier stage is provided with feedback signals from an adjustable differential negative feedback network, wherein that adjustable differential negative feedback network is calibrated so as to adjust the net gain of at least one of the differential paths in the feedback network such that the net gain of each of the differential feedback paths is substantially the same. In accordance with the present invention, such calibration operations may be performed at any time, however, typical embodiments perform the calibration operation at power-up.

Some embodiments use passive circuit elements in the differential feedback paths, and further use a summing amp, such as, for example a current source or current DAC. In further embodiments, common-mode bootstrapping of summing amp output is used, along with the gain calibration to maximize common-mode rejection ratio.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

FET, as used herein, refers to metal-oxide-semiconductor field effect transistors (MOSFETs). These transistors are also known as insulated gate field effect transistors (IGFETs).

Figure 1:
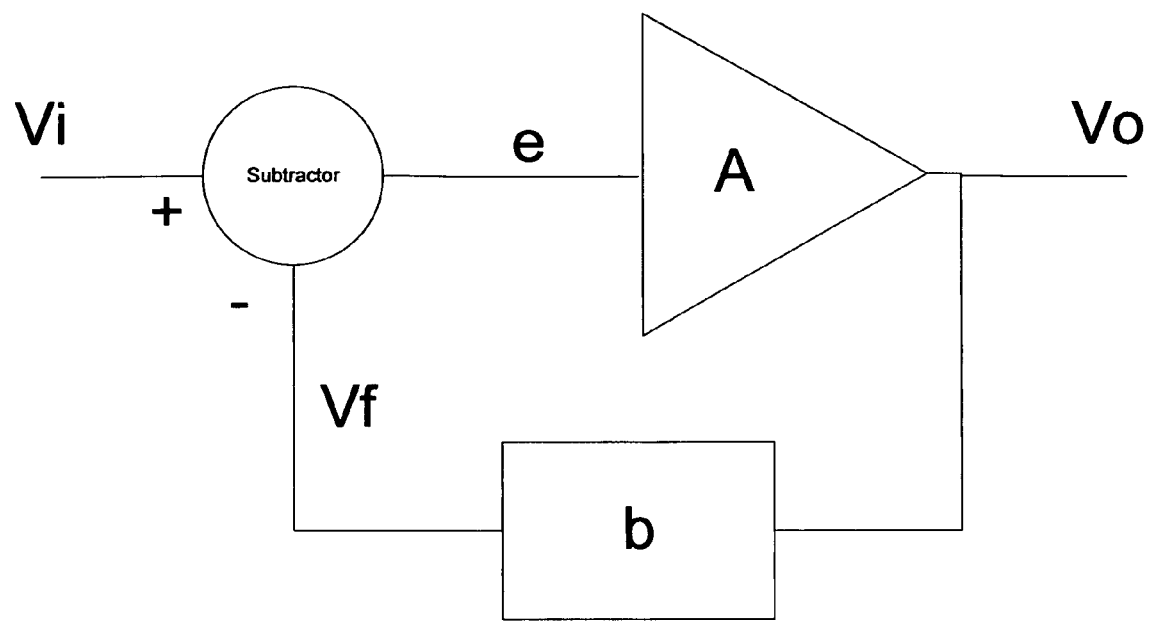
FIG. 1 is a schematic diagram of a generic feedback system.

Referring to FIG. 1, a generic feedback system is shown. Feedback signal Vf is subtracted from input signal Vi to produce an error signal e. The error signal, e, gets forward gain A to produce output Vo. The output signal, Vo, is applied to the feedback block b, which produces the feedback signal Vf, as $Vf=b*Vo$. Simple arithmetic gives the feedback equation $Vo/Vi=A/(1+A*b)=1/((1/A)+b)$, which for $A>>1$ gives $Vo/Vi=1/b$. Thus, the gain of the feedback system is primarily defined by the gain of the feedback network.

Figure 2:
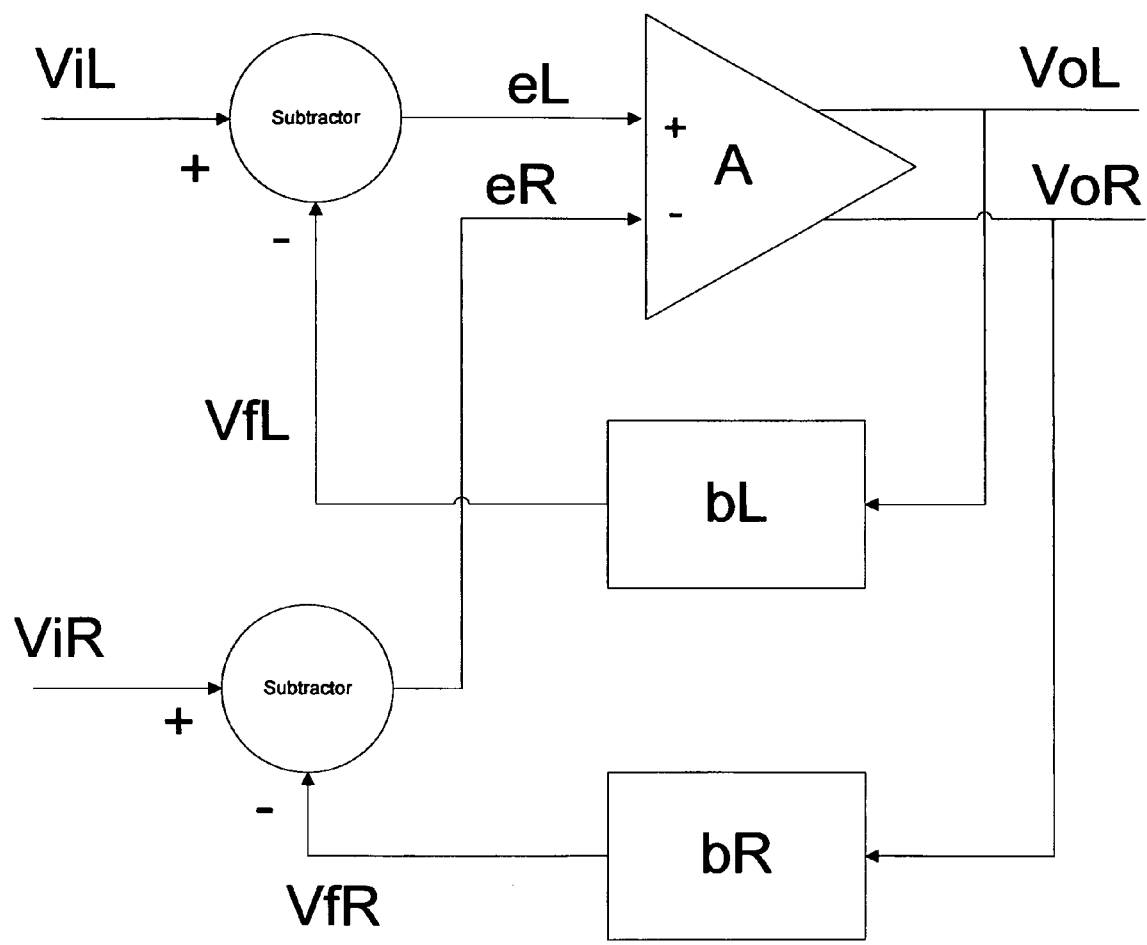
FIG. 2 is a schematic diagram of a differential feedback system.

FIG. 2 shows a differential feedback system. In this case, there are two feedback circuit blocks to consider, and are referred to as the left and right feedback circuit blocks. The left and right feedback circuit blocks respectively provide gain bL and bR. The differential gain $(VoL-VoR)/(ViL-ViR)$ is now essentially $1/b$—if $bL=bR=b$. Another feature of having $bL=bR$ is that changes in the Common-Mode (CM) output $(VoL+VoR)/2$ do not produce any change in the Differential-Mode (DM) output $(VoL-VoR)$. Conversion of CM to DM is what causes PSRR to degrade. This occurs because a change in the power supply of a feedback amplifier causes a change in the CM output. With perfect differential gain matching, one would have essentially infinite PSRR.

Disclosed herein are apparatus and methods for adjusting the two gains of a differential feedback system such that the PSRR, and generally Common-Mode Rejection Ratio (CMRR) are set in a desired way. Usually, this means adjusting the two feedback gains to exactly match each other. By way of illustration, and not limitation, various embodiments of the present invention may achieve adjustment of the feedback gains during one or more of: a calibration procedure that is performed when a product is manufactured, when it is powered up, or when in normal operation. It is noted that there may be other reasons for calibrating the gains of the feedback circuits, including, but not limited to, noise and distortion reduction. It is further noted that while these gains are typically desired to be substantially equal, there may be other settings that for various reasons achieve similar desired results but which are not equal, for example, to compensate for some additional defect or condition.

Various embodiments of the present invention may be embedded as part of a larger system, or may be implemented in a domain different than strictly electrical as described, such as, but not limited to, hydraulic, thermal, and optical systems. The inputs and outputs may be signals other than voltages, such as phase, frequency, and so on. Feedback structures that differ in some way from the generic configuration shown in FIG. 2 may be employed in accordance with the present invention. The basic concept of calibrating the gain of one or both feedback paths in a differential feedback amplifier arrangement so as to achieve improved circuit performance is still applicable.

Figure 5:
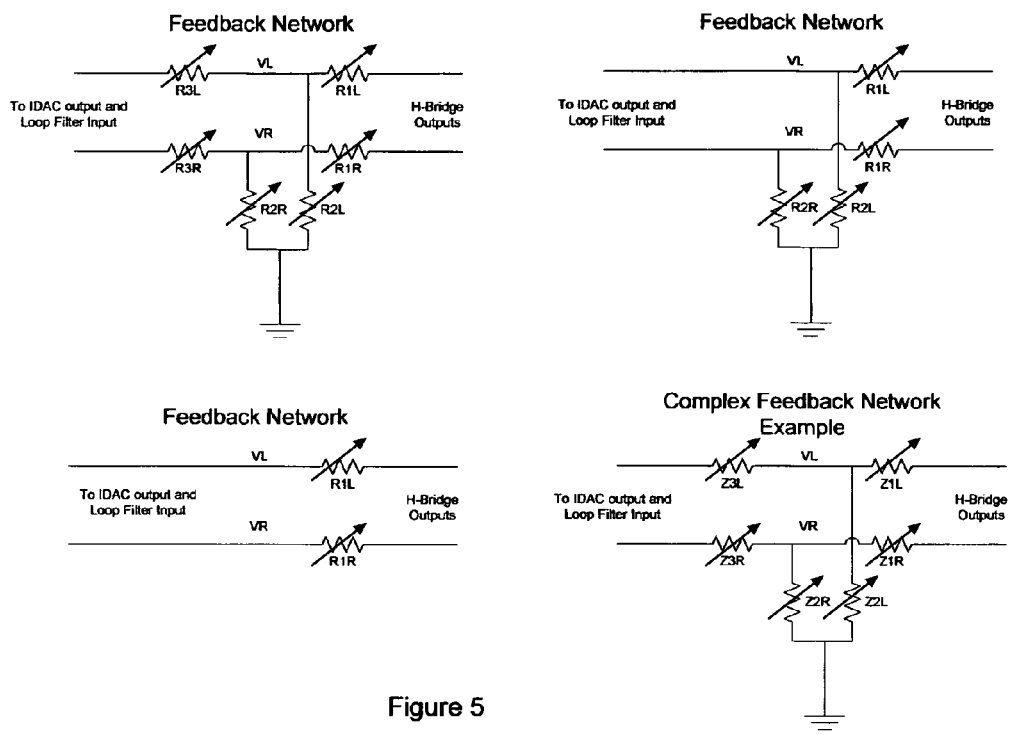
FIG. 5 is a schematic diagram showing illustrative feedback networks coupled between H-bridge outputs on one side, and the output terminals of a current DAC and the input terminals of a loop filter on the other side.

FIG. 5 illustrates several feedback network configurations. The feedback network may consist of all six resistors of a full T network (i.e., R1L, R1R, R2L, R2R, R3L, R3R), it may consist of four resistors of a simple divider (i.e., R1L, R1R, R2L, R2R), it may consist of simply two resistors (i.e., cases, R1L, R1R). In any of these cases, one or more of these elements are adjusted as part of the calibration process. It is possible to adjust just one side (L or R) of the feedback network, or both. The feedback network can be as complex and varied as needed for a particular embodiment. Still, the basic concept of adjusting the gains will apply. The calibration may be done at one frequency (such as DC) or at several frequencies. The calibration may adjust reactive elements as well as resistive ones. Feedback circuit elements may be passive, active, or a combination of passive and active.

One application that would benefit from the improved PSRR provided by embodiments of the present invention is the Class-D amplifier. This is true because variations in the H-bridge supply typically translate directly to variations in the output CM. In this case, differential feedback from the H-Bridge outputs would pass through a feedback network in preparation to forming a closed loop with the input signal. This configuration is shown in FIG. 3, in this case with a current input and a resistive-T feedback network, and the H-Bridge outputs driving an output filter coupled to a speaker.

Figure 3:
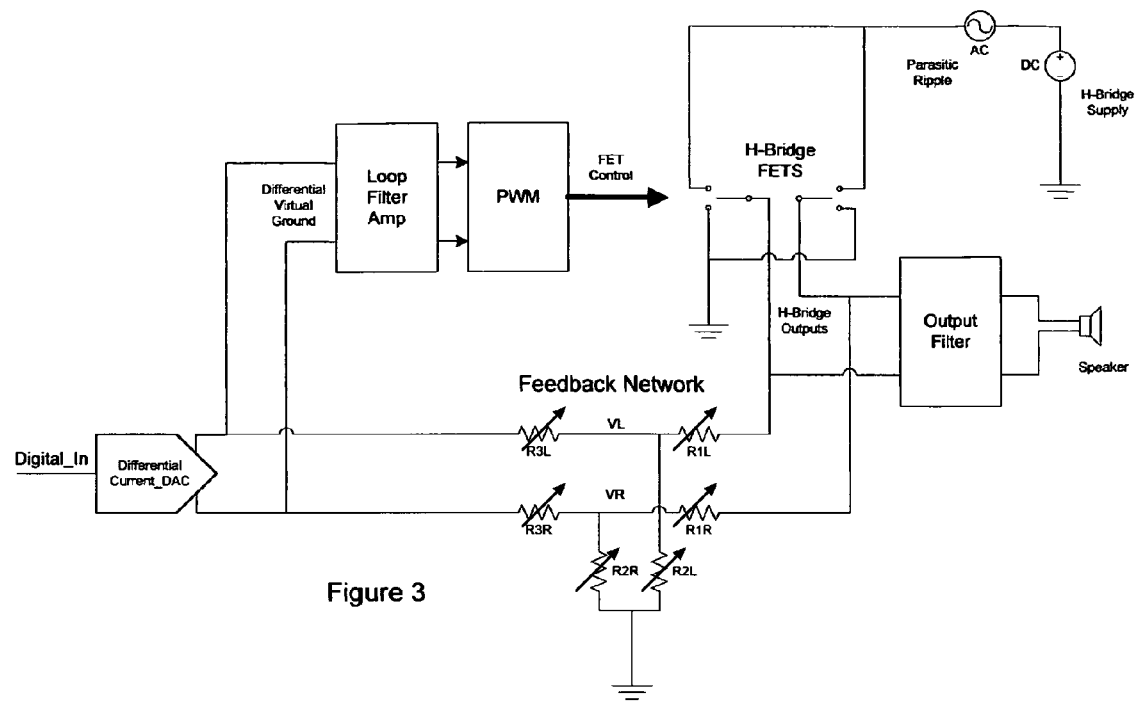
FIG. 3 is a schematic diagram of a Class-D amplifier where the feedback loop is closed as a current sum between the feedback and an input signal from a current DAC.

FIG. 3 demonstrates a Class-D amplifier where the feedback loop is closed as a current sum between the feedback and an input signal from a current DAC. In this case, it is possible to adjust the values of the feedback resistors (one or more of R1L, R1R, R2L, R2R, R3L, R3R) so as to balance the feedback gains of the L and R sides. This will result in essentially zero conversion of the variation from the H-Bridge supply being converted to differential current injected into the Loop Filter input summing nodes. With no CM-to-DM conversion, there is essentially complete rejection of the H-Bridge-variation in the speaker output.

Figure 4:
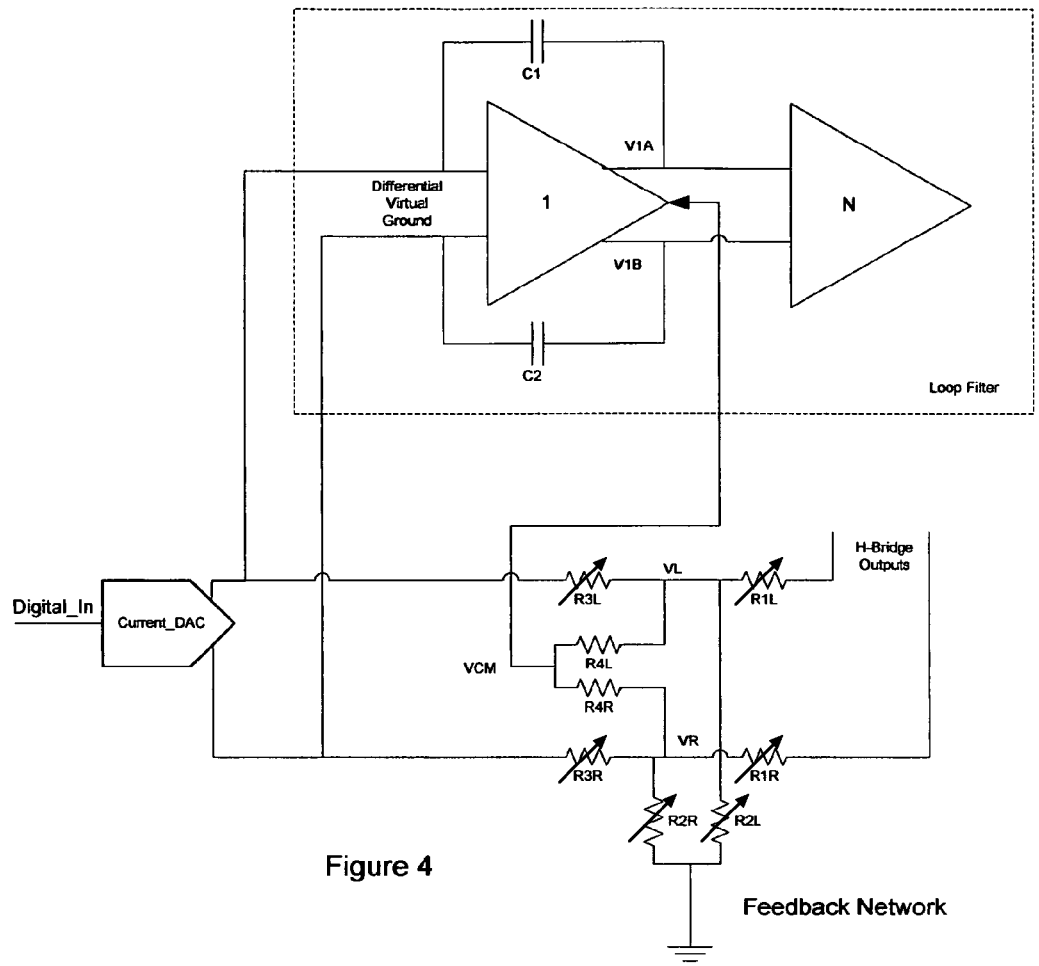
FIG. 4 is a schematic diagram showing bootstrapping of the CM output of the input stage of the loop filter so that it tracks the CM of the divider nodes.

Referring to FIG. 4, it can be seen that this PWM architecture takes advantage of the loop filter's input summing node to passively combine a simple input current DAC with a simple passive feedback signal with no intervening active circuitry. This is attractive from the point of view of noise and distortion, especially considering the high dV/dt present at the H-Bridge outputs. One design detail that can improve the function of the PSRR calibration is to bootstrap the CM output of the input stage of the loop filter so that it tracks the CM of the "divider nodes" VL and VR. Feeding ½ (VL+VR) to the bias network of the first loop filter stage so that its output tracks this CM signal ensures that the input CM impedance of the loop filter does not interact with the "injector resistors" (R3L and R3R) as a function of frequency. Failing to do this bootstrapping will result in the imbalance of R3L and R3R expressing themselves upon PSRR in a frequency-dependent way. As shown in FIG. 4, R4L and R4R form VCM=½(VL+VR) and route it to the CM bias control of the first stage of the loop filter. Circuitry internal to that first stage takes signal VCM and ensures that stage 1 CM output voltage Y2 (V1A+V1B) track VCM. Doing this removes the CM load of the large filter capacitors C1 and C2 from being seen at the input of stage 1 since the input of stage 1 loop filter naturally tracks VCM. The CM signal across each of C1 and C2 is zero because of the bootstrap.

Various embodiments of the present invention provide a differential feedback amplifier containing a feedback network wherein said network is adjustable as to improve the CMRR of the amplifier.

In one embodiment, the feedback network consists of four resistor dividers.

In one embodiment, the amplifier is a Class D amplifier.

In one embodiment, the feedback network consists of six resistors in a differential T configuration.

In one embodiment in accordance with the present invention a circuit includes a Class D amplifier provided with a passive differential feedback summing with an input current at a differential virtual ground produced by an amplifier which is a sub-section of the Class D amplifier. This passive differential feedback network may consist of a 6-resistor T network in a particular embodiment. It is noted that the common-mode voltage of the center of the differential T-network is operable to bootstrap the output voltage of the amplifier stage producing the virtual ground.

Various embodiments of the present invention provide a Class-D amplifier with differential negative feedback. In some embodiments, a Class-D amplifier is provided with differential negative feedback wherein the feedback includes a voltage divider with programmable gain. In some embodiments, a Class-D amplifier is provided with differential negative feedback wherein the feedback signals combine with the input signal at an electronic virtual ground. In some embodiments, a Class-D amplifier is provided with differential negative feedback wherein the feedback signals combine with the input signal at an electronic virtual ground wherein the feedback path consists of a T-network (i.e., a voltage divider followed by a resistor) for injecting current into the virtual ground. In some embodiments, a Class-D amplifier is provided with differential negative feedback wherein the feedback signals combine with the input signal at an electronic virtual ground and wherein the common mode output of the amplifier that creates the virtual ground is made to track the common-mode of the feedback signal at the voltage divider of the feedback network. In some embodiments, a Class-D amplifier is provided with differential negative feedback wherein the feedback signals combine with the input signal at an electronic virtual ground and wherein the input signal is in the form of a current source or current DAC. In some embodiments, a Class-D amplifier is provided with differential negative feedback wherein the gains of the two sides of the feedback are independently adjustable. In some embodiments, a Class-D amplifier is provided with differential negative feedback wherein the gains of the two sides of the feedback are independently adjustable so as to improve the CMRR from the H-Bridge. power supply to the amplifier output. In some embodiments, a Class-D amplifier is provided with differential negative feedback wherein the gains of the two sides of the feedback are independently adjustable and precisely calibrated so as to improve the CMRR from the H-Bridge power supply to the amplifier output to the maximum extent possible.

In one illustrative embodiment of the present invention, a method of operating a Class D amplifier, the Class D amplifier including an H-Bridge amplifier stage, a loop filter including a first loop filter amplifier, and a differential feedback network coupled between the H-Bridge and the loop filter, includes voltage dividing an output of a first leg of the H-Bridge to generate a first feedback signal; voltage dividing an output of a second leg of the H-Bridge to generate a second feedback signal; generating, by the first loop filter amplifier, an electronic virtual ground; coupling the first and second feedback signals to the first loop amplifier; coupling an input signal to the electronic virtual ground; and receiving, at the first loop filter amplifier, a signal by which the common-mode output of the first loop filter amplifier tracks a common-mode voltage of the differential feedback network.

In another illustrative embodiment of the present invention, a method of calibrating a differential feedback network in a Class D amplifier, the differential feedback network having a pair of feedback paths, the Class D amplifier including an H-Bridge amplifier stage having output nodes, a loop filter including a first loop filter amplifier, and the differential feedback network coupled between the H-Bridge amplifier output nodes and the loop filter, includes operating the Class D amplifier such that the H-Bridge output nodes are driven with a common mode test signal; measuring gain balance in the differential feedback network; and adjusting, if the difference in gain between each feedback path is greater than a predetermined threshold, the net gain of at least one of the feedback paths of the differential feedback network. In some embodiments, the common mode test signal is provided through a power supply node of the H-Bridge. Such calibration is typically performed during a power-up sequence, and is typically controlled by a microcontroller, a state machine, or similar well-known hardware/firmware combination. Such a "calibration machine" may be co-located on a single integrated with the Class D amplifier, or may be disposed in any suitable physical arrangement of internal and external components. The net gain calibration of a feedback path of the differential feedback network in accordance with the present invention, may be achieved in any suitable manner, but is typically achieved through the use of programmable resistances in the feedback paths. One objective of performing such net gain calibrations is to reduce the differential mode to zero, or at least less than some predetermined amount.

Conclusion

The exemplary apparatus illustrated and described herein find application in at least the fields of consumer electronics and audio amplifiers.

It is to be understood that the present invention is not limited to the embodiments described above, but encompasses any and all embodiments within the scope of the subjoined Claims and their equivalents.

What is claimed is:

1. A Class D amplifier, comprising:
an H-Bridge amplifier, the H-Bridge amplifier having a first output terminal and a second output terminal; and
an adjustable differential negative feedback network coupled to receive output signals of the H-Bridge amplifier, the adjustable differential negative feedback network having at least a left feedback path and a right feedback path;
wherein the adjustable differential negative feedback network is operable to modify the net gain of at least one of the left feedback path and the right feedback path;
wherein the adjustable differential feedback network comprises a left feedback path and a right feedback path:
wherein the left feedback path comprises a first voltage divider, the first voltage divider having a first circuit element coupled between the first output terminal of the H-Bridge amplifier and a first intermediate node, a second circuit element coupled between the first intermediate node and a ground node, a third circuit element coupled between the first intermediate node and an output terminal of the left feedback path, and a fourth circuit element coupled between the first intermediate node and a common-mode bias control terminal of a first stage of a loop filter; and
wherein the right feedback path comprises a second voltage divider, the second voltage divider having a fifth circuit element coupled between the second output terminal of the H-Bridge amplifier and a second intermediate node, a sixth circuit element coupled between the second intermediate node and the ground node, a seventh circuit element coupled between the second intermediate node and an output terminal of the right feedback path, and an eighth circuit element coupled between the second intermediate node and the common-mode bias control terminal of the first stage of the loop filter.

2. The Class D amplifier of claim 1, wherein the adjustable differential negative feedback network is operable to modify the net gain of at least one of the left feedback path and the right feedback path, such that the net gain of each of the left and right feedback paths are substantially equal.

3. The Class D amplifier of claim 1, wherein the adjustable differential negative feedback network is operable to modify the net gain of each of the left and right feedback paths such that the net gain of each of the left and right feedback paths are substantially equal.

4. The Class D amplifier of claim 1, wherein the adjustable differential negative feedback network comprises a voltage divider having programmable gain in at least one of the left feedback path and the right feedback path.

5. The Class D amplifier of claim 1, further comprising:
a pulse width modulation circuit coupled to the H-Bridge amplifier;
a loop filter having a first and a second input terminal and at least one output terminal, the loop filter coupled between the pulse width modulation circuit and the adjustable differential negative feedback paths; and
a differential current digital-to-analog converter (DAC) having a first and a second output terminal, the first and second output terminals coupled respectively to the left and right feedback paths, the first and second output terminals of the DAC further coupled respectively to the first and second input terminals of the loop filter.

6. The Class D amplifier of claim 5, wherein H-Bridge amplifier is comprised of field effect transistors; and the output terminals of the H-Bridge amplifier are coupled to an output filter.

7. The Class D amplifier of claim 6, wherein the output filter is coupled to a speaker.

8. The Class D amplifier of claim 1, wherein the first, second, third, fourth, fifth, sixth, seventh, and eighth circuit elements are resistive.

9. The Class D amplifier of claim 1, wherein two or more of the first, second, third, fourth, fifth, sixth, seventh, and eighth circuit elements are complex circuits elements having resistance and reactance.

10. The Class D amplifier of claim 1, wherein the output terminal of the left feedback path is coupled to a current DAC, and the output terminal of the right feedback path is coupled to the current DAC.

11. The Class D amplifier of claim 1, wherein the voltage at the common-mode bias control terminal is one-half of the sum of the voltage of the first intermediate node and the voltage of the second intermediate node.

12. A method of calibrating a differential feedback network in a Class D amplifier, the differential feedback network having a pair of feedback paths, the Class D amplifier including an H-Bridge amplifier stage having output nodes, a loop filter including a first loop filter amplifier, and the differential feedback network coupled between the H-Bridge amplifier output nodes and the loop filter, comprising:
  operating the Class D amplifier such that the H-Bridge output nodes are driven with a common mode test signal;
  adjusting the net gain of at least one of the feedback paths of the differential feedback network;
  wherein the adjusting is controlled by a hardware/firmware combination.

13. The method of claim 12, wherein the common mode test signal is provided through a power supply node of the H-Bridge.

14. The method of claim 12, wherein the hardware/firmware combination comprises a microcontroller.

15. The method of claim 12, wherein the hardware/firmware combination comprises a state machine.

16. The method of claim 12, wherein the step of adjusting the net gain of at least one of the feedback paths of the differential feedback network reduces a differential mode.

17. The method of claim 16, wherein the differential mode is reduced to an amount that is less than a predetermined amount.

18. The method of claim 16, wherein the differential mode is reduced to zero.

19. The method of claim 12, wherein the step of adjusting the net gain of at least one of the feedback paths of the differential feedback network is performed during a power-up sequence.

* * * * *